United States Patent [19]

Trausch

[11] 4,264,714

[45] Apr. 28, 1981

[54] PROCESS FOR THE MANUFACTURE OF PRECISION TEMPLATES

[75] Inventor: Günter E. Trausch, Munich, Fed. Rep. of Germany

[73] Assignee: Siemens Aktiengesellschaft, Berlin & Munich, Fed. Rep. of Germany

[21] Appl. No.: 47,475

[22] Filed: Jun. 11, 1979

[30] Foreign Application Priority Data

Jun. 29, 1978 [DE] Fed. Rep. of Germany ....... 2828625

[51] Int. Cl.³ .............................................. G03C 5/00
[52] U.S. Cl. .................................. 430/320; 430/324; 430/394; 430/396
[58] Field of Search ............... 430/324, 296, 320, 315, 430/523, 396, 394

[56] References Cited

U.S. PATENT DOCUMENTS

| 2,559,389 | 7/1951 | Beeber et al. | 430/324 |
| 3,507,654 | 4/1970 | Wrench | 430/396 |
| 4,115,120 | 9/1978 | Dyer et al. | 430/315 |

FOREIGN PATENT DOCUMENTS 484816 5/1978 U.S.S.R. .................................. 430/324

Primary Examiner—Won H. Louie, Jr.
Attorney, Agent, or Firm—Hill, Van Santen, Steadman, Chiara & Simpson

[57] ABSTRACT

A process for the manufacture of precision flat parts such as masks, templates, and the like having very small openings therein with high contour details yet with substantial material thickness utilizes a metallized glass carrier having a stencil etched thereon with a negative working photo resist laminated on it. Exposure of photo resist is achieved through the glass so that maximum intensity of light in the photo resist occurs at the juncture between tne photo resist and the glass carrier for maximum adhesion. Irregularly shaped apertures can be generated by selective varied orientation of the glass carrier during the exposure.

11 Claims, 5 Drawing Figures

PROCESS FOR THE MANUFACTURE OF PRECISION TEMPLATES

BACKGROUND OF THE INVENTION

1. Field of the Invention

The present invention relates to a process for the manufacture of flat precision parts such as masks, templates and the like, and more particularly to photolithographic methods for generation of such parts.

2. Description of the Prior Art

Masks, templates and the like having openings therein of the required small size and highly detailed contours with a thickness guaranteeing sufficient mechanical stability, can not be manufactured by conventional etching technology. A photolithographic technique is employed in the current art comprising the steps of generation of a photo resist structure on a metallic carrier, plating a metal on the carrier in the photo resist openings removing the metal-photo resist structure from the carrier, and stripping the photo resist from the metal.

The above described procedure is limited as to the fineness of detail which may be achieved by the resolution of the photo resist. The material thickness of the template produced is limited by the thickness of the photo resist. Thickness and resolution of the photo resist are chemically correlated in such a manner that taking steps to increase thickness of the photo resist decreases resolution and likewise increased resolution demands decreased photo resist thickness. A template requiring finely detailed openings thus cannot be produced with high material thickness, by the conventional means.

A further disadvantage of the known methods is that after exposing and developing the photo resist on the carrier, the uppermost portions of the photo resist are more intensively exposed resulting in a tapering of the resist from an upper widest point to a narrowest point where the resist meets the carrier. Apertures having a trapezoidal cross section are thus produced. Further, in the conventional process a small air gap always exists between the mask, which is not perfectly flat, and the resist. When dry photo resist is utilized, having a protective foil attached thereto, an additional distance between the mask and the resist is created.

SUMMARY OF THE INVENTION

In accordance with the principles of the present invention a process for the manufacture of thick precision templates and the like utilizes a glass carrier having a metallized layer thereon, in which the pattern of the template is generated by conventional photolithographic and etching techniques. A negative working photo resist layer is then applied to the glass-metal pattern structure with exposure occurring through the glass followed by development. The material of which the template is to be made is then plated on the carrier with apertures formed therein in the volumes occupied by the developed photo resist. The photo resist and carrier are then removed, leaving a finely detailed, thick template.

Various refinements in the generation of the template can be carried out in the portion of the process during which the photo resist is exposed. For example, the glass carrier may be rotated being inclined at selected angles from a perpendicular to incident light in order to vary the angle of incidence and thus vary the inclination of photo resist walls. Apertures having desired inclination of walls can thus be generated.

A similar effect can be achieved by utilizing multiple exposures of the resist wih different light sources. This method is particularly adapted for the generation of openings intended for use as nozzles.

Additionally by stepwise lamination and exposure of two or more photo resist layers using rotation and different inclination of the substrate during each exposure apertures with staged walls can be achieved.

A well known technique is to produce templates consisting of a fine mask which contains all details and a coarse mask which is to give stability and contains no details but coarse openings instead. Such a technique requires expensive and often imprecise optical alignment but can be simplified applying the inventive process by utilizing the fine mask on the glass carrier to expose the photo resist above which is to define the coarse mask except at those areas of the fine mask which contain the details and which have to be covered by a second exposure through a mask roughly aligned.

DESCRIPTION OF THE PREFERRED EMBODIMENTS

Figure 1A:
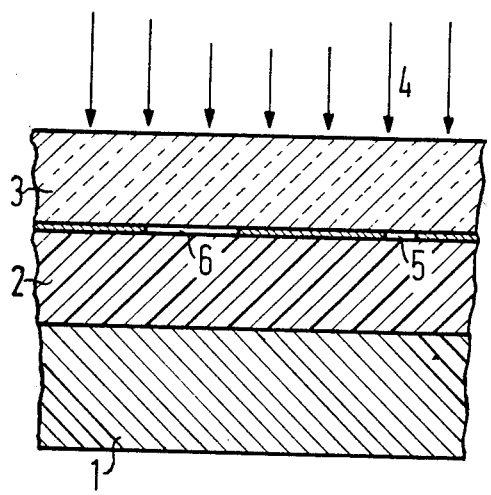
FIG. 1a shows a conventional process for generating a template.

The first step in the conventional method of producing flat, thin precision masks templates and the like is shown in FIG. 1a. In that method, a metallic carrier 1 is covered with a layer of negative photo resist 2 which in turn is covered with an exposure mask 3. The exposure mask 3 has a layer 3a on one side thereof which may be etched, cut or otherwise removed to form a desired pattern. In the sample shown in FIG. 1a, the layer 3a has a small aperture 5 and a larger aperture 6 therein.

Ultraviolet radiation 4 is directed at the structure of FIG. 1a in the direction of the arrows shown. The incident light 4 passes through the transparent areas 5 and 6 and triggers polymerization reactions in the photo resist thus causing nonsolubility in the developer.

Figure 1B:
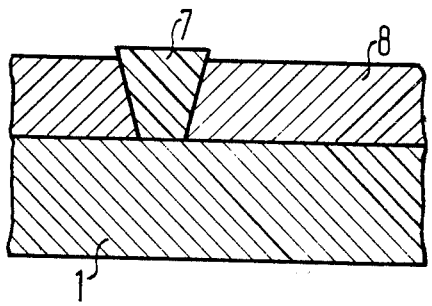
FIG. 1b shows a later stage in the process of FIG. 1a where the non-exposed portion of the photo resist has been stripped away.

As shown in FIG. 1b, the non-exposed parts are stripped away so that only a developed resist residue 7 remains. As can be seen by the cross section of FIG. 1b, the conventional method produces developed resist areas such as 7 which are trapezoidal in cross section. This is due to the absorption of ultraviolet radiation in the photo resist causing overexposure in the uppermost portions compared to those close to the carrier so that a straight walled photo resist is not achieved with the known photo resists. As can also be seen in FIG. 1b, the aperture 5 was too small to generate a photo resist portion which is sufficiently resistant to remain during the developing process.

As also shown in FIG. 1b, after the non-exposed photo resist layer 2 has been removed, a layer 8 of suitable material, such as nickel, is electroplated on to the surface of the carrier 1, followed by removal of the carrier 1 and photo resist 7 to leave a metal template having apertures therein.

Figure 2A:
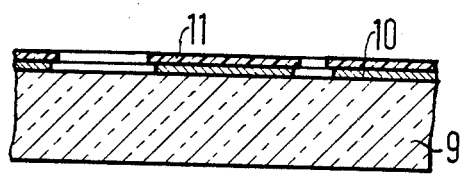
FIG. 2a shows a first step in the process disclosed herein for producing a thick high precision template.

The first step of the inventive process herein is shown in FIG. 2a, wherein a glass substrate as carrier 9 having a metallized layer 10 on one side thereof is covered with a first thin photo resist layer 11 which is utilized to produce a pattern in metallized layer 10 by conventional photolithographic and etching methods. Utilization of a thin photo resist layer 11 to produce the stencil allows achievement of a high degree of resolution and thus a high degree of detail in the stencil presented by the metallized layer 10. After generation of the pattern in the metallized layer 10, the photo resist layer 11 is removed.

Figure 2B:
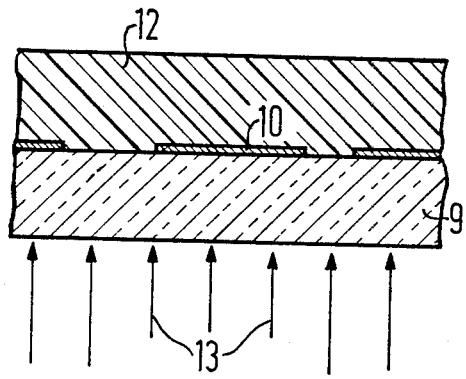
FIG. 2b shows a second step in the process of FIG. 2a during which a photo resist layer is exposed to light.

The next step in the inventive process is shown in FIG. 2b wherein the photo resist layer 11 has been removed and a photo foil 12 applied to the carrier-stencil structure. Exposure occurs through the glass carrier 9 in the direction of the arrows 13, so that the portions of the photo foil 12 closest to the carrier 9 are most intensively exposed.

Figure 2C:
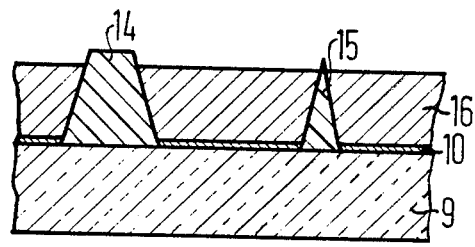
FIG. 2c shows a completed template produced by the inventive process disclosed herein still resting on the glass carrier.

As shown in FIG. 2c, the use of incident light from beneath, rather than from above in the conventional process of FIG. 1a, results in developed photo resist areas 14 and 15 which taper in the opposite direction of the conventional developed areas. For the same reason, very small apertures such as 15 can be generated, which was not possible with the conventional process. The taper of the exposed areas 14 and 15 can even have functional advantages, because small conical apertures such as 15 are ideally suited for use as nozzles.

The developed photo resist structures 14 and 15 also exhibit high adhesion strength to the carrier 9 because the most highly exposed portion is closest to the carrier 9, so that even very small photo resist portions such as 15 are not stripped during the developing process.

During exposure the carrier covered with photo resist may rotate round an axis which is rectangular to the carrier but inclined to incident light. This results in constant inclination of photo resist walls and also the template's walls.

The inventive process herein also allows a second or further layer of resist foil 12 to be laminated on top of the first or preceding resist layer not yet developed and to be exposed at an angle of inclination to light direction each greater than the preceding one so that apertures having staged walls with different inclinations can be generated.

The inventive concept herein has a further application in the printing technology if, as shown in FIG. 2c, the exposed areas of photo resist such as 14 and 15 do not extend above the height of the plated layer 16. An additional template having surface reliefs therein corresponding to the areas of photo resist can be produced.

In all of the above embodiments, separation of the metal plate 16, which is the template, and the carrier 9 and developed photo resist areas 14 and 15 is undertaken by conventional stripping or chemical methods. Separation of the parts may be further facilitated by a favorable selection of stencil material and plating material, such as nickel and molybdenum.

The process disclosed herein may also be utilized in connection with conventional photolithographic methods in order to produce very thick templates by exposure at different times through opposite sides of the photo resist 12. The process described in FIGS. 2a through 2c may be supplemented by conventional exposure from a second light source above the carrier 9 through a superimposed mask placed above the photo resist.

The spaces lying between the resist structure can also be filled by means of casting, for example, with a synthetic material, instead by means of electro plating. The casting material can be used to fill the apertures to a level even with the top of the resist structure, or fill the apertures slightly above the resist structure so that plates having surface reliefs thereon can be generated which may be used in printing technology.

Although changes and modifications may be suggested by those skilled in the art, it is the intention of the inventor to embody within the patent warranted hereon all changes and modifications as reasonably and properly come within the scope of his contribution to the art.

I claim as my invention:

1. A process for the manufacture of precision flat parts having apertures formed therein comprising the steps of:
   metallizing a thin layer of metal on one side of a flat glass substrate;
   removing selected portions of said metal layer to expose portions of said glass substrate;
   directly covering said metallized layer and said exposed portions of said glass substrate with a thick layer of negative working photo resist;
   forming a plurality of tapered developed photo resist areas by exposing said photo resist to a light source which is disposed on an opposite side of said substrate such that light passes through said glass substrate before reaching said photo resist, whereby photo resist behind said exposed portions of said glass substrate is developed to a decreasing extent with increasing distance from said substrate;
   removing unexposed photo resist;
   plating a second metal layer above said thin metallized layer to cover areas not occupied by exposed photo resist; and
   removing said exposed photoresist and said glass substrate, thereby forming a precision flat part having apertures formed therein.

2. The process of claim 1 including the additional step of inclining said substrate and photo resist at an angle with respect to incident light to produce exposed portions of said photo resist having correspondingly inclined side walls.

3. The process of claim 1 including the additional step of inclining said substrate and said photo resist at at least two of different angles during exposure to produce differently inclined side walls.

4. The process of claim 2 including the additional step of simultaneously rotating said inclined substrate and photo resist during exposure about an axis perpendicular said substrate.

5. The process of claim 4 including the additional steps of laminating an additional photo resist layer above the initial photo resist layer after exposure but before said initial photo resist layer is developed, and changing the angle of inclination of said substrate and said photo resist after said laminating step during said exposure step to produce exposed portions of said initial and said additional photo resist layers having correspondingly varying inclined side walls.

6. The process of claim 1 including the additional steps of:

superimposing a mask over said photo resist layer after exposing said photo resist through said glass substrate, said mask having openings therein corresponding to said removed portions of said metallized layer, and exposing said photo resist to a second light source through said mask after exposing said photo resist through said glass substrate.

7. The process of claim 1 including the additional step of selecting said metals comprising said metallized layer and said second metal layer from metals which are easily separable.

8. A process for the manufacture of precision flat parts having apertures formed therein comprising the steps of:

metallizing a thin layer of metal on one side of a flat glass substrate;

removing selected portions of said metal layer to expose portions of said glass substrate;

directly covering said metallized layer and said exposed portions of said glass substrate with a thick layer of negative working photo resist;

forming a plurality of tapered developed photo resist areas by exposing said photo resist to a light source which is disposed on an opposite side of said substrate such that light passes through said glass substrate before reaching said photo resist, whereby photo resist behind said exposed portions of said glass substrate is developed to a decreasing extent with increasing distance from said substrate;

developing said photo resist and removing unexposed areas thereof;

casting a second metal or synthetic material in areas not occupied by exposed photo resist; and removing said exposed photoresist and said glass substrate, thereby forming a precision flat part having apertures formed therein.

9. The process of claim 8 wherein said casting is terminated when said second metal or synthetic material reaches a level equal to a top of said exposed photo resist.

10. A process for the manufacture of precision flat parts having apertures formed therein comprising the steps of:

metallizing a thin layer of metal on one side of a flat glass substrate;

removing selected portions of said metal layer to expose portions of said glass substrate, directly covering said metallized layer and said exposed portions of said glass substrate with a thick layer of negative working photo resist;

forming a plurality of tapered developed photo resist areas by exposing said photo resist to a light source which is disposed on an opposite side of said substrate such that light passes through said glass substrate before reaching said photo resist, whereby photo resist behind said exposed portions of said glass substrate is developed to a decreasing extent with increasing distance from said substrate;

developing said photo resist and removing unexposed areas thereof; and casting a second metal or synthetic material in areas not occupied by exposed photo resist so that said second metal extends above the top of said exposed photo resist to produce a flat part having surface reliefs thereon.

11. The process of claim 1 including the additional steps of:

superimposing a mask over said photo resist layer before exposing said photo resist through said glass substrate, said mask having openings therein corresponding to said removed portions of said metallized layer, and exposing said photo resist to a second light source through said mask simultaneously with exposing said photo resist through said glass substrate.

* * * * *